United States Patent
Mima et al.

(10) Patent No.: US 9,621,040 B2
(45) Date of Patent: Apr. 11, 2017

(54) PWM SIGNAL GENERATOR AND SWITCHING POWER SUPPLY DEVICE HAVING SAME

(71) Applicant: Sanken Electric Co., LTD., Niiza-shi, Saitama (JP)

(72) Inventors: Kazuhiro Mima, Niiza (JP); Hiroki Yukiyama, Niiza (JP); Takanaga Yamazaki, Niiza (JP)

(73) Assignee: Sanken Electric Co., LTD., Niiza-shi, Saitama (JP)

( * ) Notice: Subject to any disclaimer, the term of this patent is extended or adjusted under 35 U.S.C. 154(b) by 0 days.

(21) Appl. No.: 14/830,840

(22) Filed: Aug. 20, 2015

(65) Prior Publication Data

US 2017/0054365 A1 Feb. 23, 2017

(51) Int. Cl.
*H03K 7/08* (2006.01)
*H02M 3/156* (2006.01)
*H03K 5/133* (2014.01)
*H03K 5/00* (2006.01)

(52) U.S. Cl.
CPC .......... *H02M 3/156* (2013.01); *H03K 5/133* (2013.01); *H03K 7/08* (2013.01); *H03K 2005/00058* (2013.01)

(58) Field of Classification Search
CPC ......... H02M 3/156; H03K 7/08; H03K 5/133; H03K 2005/00058
USPC ....................................................... 323/282
See application file for complete search history.

(56) References Cited

U.S. PATENT DOCUMENTS

| | | | |
|---|---|---|---|
| 6,720,811 B2 * | 4/2004 | Yazawa | G06F 1/10 327/161 |
| 6,924,684 B1 * | 8/2005 | Nguyen | G06F 7/68 327/122 |
| 7,312,668 B2 | 12/2007 | Li et al. | |

(Continued)

FOREIGN PATENT DOCUMENTS

| JP | 6021790 A | * | 7/1992 |
|---|---|---|---|
| JP | 10-145192 A | * | 5/1998 |

(Continued)

OTHER PUBLICATIONS

Received search report from STIC EIC 2800 seacher Benjamin Martin on Sep. 7, 2016.*

Primary Examiner — Timothy J Dole
Assistant Examiner — Htet Z Kyaw
(74) Attorney, Agent, or Firm — Banner & Witcoff, Ltd.

(57) ABSTRACT

A PWM signal generator includes a delay circuit unit, which includes a plurality of delay elements connected in series, an output terminal of the delay element in a final stage among the plurality of delay elements and an input terminal of the delay element in an initial stage among the plurality of delay elements being connected to each other; a selector, which selects any one of output signals of the plurality of delay elements based on a digital value; a PWM signal output unit, which outputs a PWM signal based on the output signal selected by the selector; a delay-amount detector, which detects an amount of delay of a signal due to the delay circuit unit; and a digital value generator, which generates the digital value by correcting predetermined data based on the amount of delay detected by the delay-amount detector.

7 Claims, 3 Drawing Sheets

(56) References Cited

U.S. PATENT DOCUMENTS

| | | | | |
|---|---|---|---|---|
| 7,567,101 | B2* | 7/2009 | Yokozeki | H03L 7/07 327/141 |
| 8,164,318 | B2* | 4/2012 | Sasaki | H02M 3/157 323/222 |
| 9,397,579 | B2* | 7/2016 | Popovici | H02M 3/33569 |
| 2001/0043652 | A1* | 11/2001 | Hooley | H03K 7/08 375/238 |
| 2006/0164176 | A1 | 7/2006 | Li et al. | |
| 2006/0248434 | A1* | 11/2006 | Radke | G06F 11/10 714/763 |
| 2008/0252277 | A1* | 10/2008 | Sase | H02M 3/157 323/283 |
| 2009/0021407 | A1* | 1/2009 | Terazawa | H03M 1/502 341/122 |
| 2013/0009719 | A1* | 1/2013 | Takahashi | H03K 7/08 332/109 |

FOREIGN PATENT DOCUMENTS

| | | | | |
|---|---|---|---|---|
| JP | 2004-343395 | A | | 12/2004 |
| JP | 3619466 | A | * | 5/2005 |
| JP | 2006-527569 | A | | 11/2006 |
| JP | 2011-135492 | A | * | 7/2011 |
| JP | 2013-236295 | A | * | 11/2013 |

* cited by examiner

PWM SIGNAL GENERATOR AND SWITCHING POWER SUPPLY DEVICE HAVING SAME

TECHNICAL FIELD

This disclosure relates to a switching power supply device that controls an output voltage by performing a switching operation with a pulse width modulation (PWM) method and a PWM signal generator used in the switching power supply device.

BACKGROUND

In a switching power supply device that controls an output voltage by performing a switching operation using a switching element such as a transistor, variable control of a duty, which is a ratio of an ON-period of the switching element to a switching cycle of the switching element, is performed to control the output voltage so as to be constant.

Devices that generate a PWM signal for performing PWM control are classified into an analog type and a digital type. Examples of a digital type PWM signal generator are described in JP-A-2004-343395 and JP-A-2006-527569.

JP-A-2004-343395 describes a PWM signal generator that uses a ring oscillator including plural differential buffers, which are connected in cascade, to generate a PWM signal with a resolution of a delay time corresponding to one stage of the differential buffers.

JP-A-2006-527569 describes a PWM signal generator that includes plural voltage-controlled buffers connected in series and a delay locked loop (DLL) controlling a delay time of each voltage-controlled buffer so as to be constant.

SUMMARY

In the PWM signal generator described in JP-A-2004-343395, the delay times of the differential buffers vary due to an influence of PVT (Process, Voltage, and Temperature). Accordingly, there is a possibility that a clock frequency of a counter using the output signal of the ring oscillator as a clock will also vary, and thus the resolution of the switching cycle or the duty will become an undesired value.

It may be considered that a DLL circuit such as in the device described in JP-A-2006-527569 is used in the PWM signal generator described in JP-A-2004-343395. However, addition of the DLL circuit causes an increase in circuit scale. Meanwhile, since the DLL circuit needs to be re-designed due to a change in semiconductor manufacturing processes, design costs may be increased. When the DLL circuit is used, it is concerned that there are a lot of restrictions such the lowest operation clock frequency, the setting order.

This disclosure is made in consideration of the above-mentioned circumstances and is to provide a PWM signal generator, which is able to prevent an increase in circuit scale or design cost and which generates a PWM signal with a desired resolution, and a switching power supply device including the PWM signal generator.

A PWM signal generator of this disclosure includes a delay circuit unit, which includes a plurality of delay elements connected in series, an output terminal of the delay element in a final stage among the plurality of delay elements and an input terminal of the delay element in an initial stage among the plurality of delay elements being connected to each other; a selector, which selects any one of output signals of the plurality of delay elements based on a digital value; a PWM signal output unit, which outputs a PWM signal based on the output signal selected by the selector; a delay-amount detector, which detects an amount of delay of a signal due to the delay circuit unit; and a digital value generator, which generate the digital value by correcting predetermined data based on the amount of delay detected by the delay-amount detector.

A switching power supply device includes: a switching element; the above described PWM signal generator; and a PWM control unit, which controls the switching element based on the PWM signal generated by the PWM signal generator.

According to this disclosure, it is possible to provide a PWM signal generator that is able to prevent an increase in circuit scale or design cost and that generate a PWM signal with a desired resolution and a switching power supply device including the PWM signal generator.

BRIEF DESCRIPTION OF THE DRAWINGS

The foregoing and additional features and characteristics of this disclosure will become more apparent from the following detailed descriptions considered with the reference to the accompanying drawings, wherein.

DETAILED DESCRIPTION

Hereinafter, embodiments of this disclosure will be described with reference to the accompanying drawings.

Figure 1:
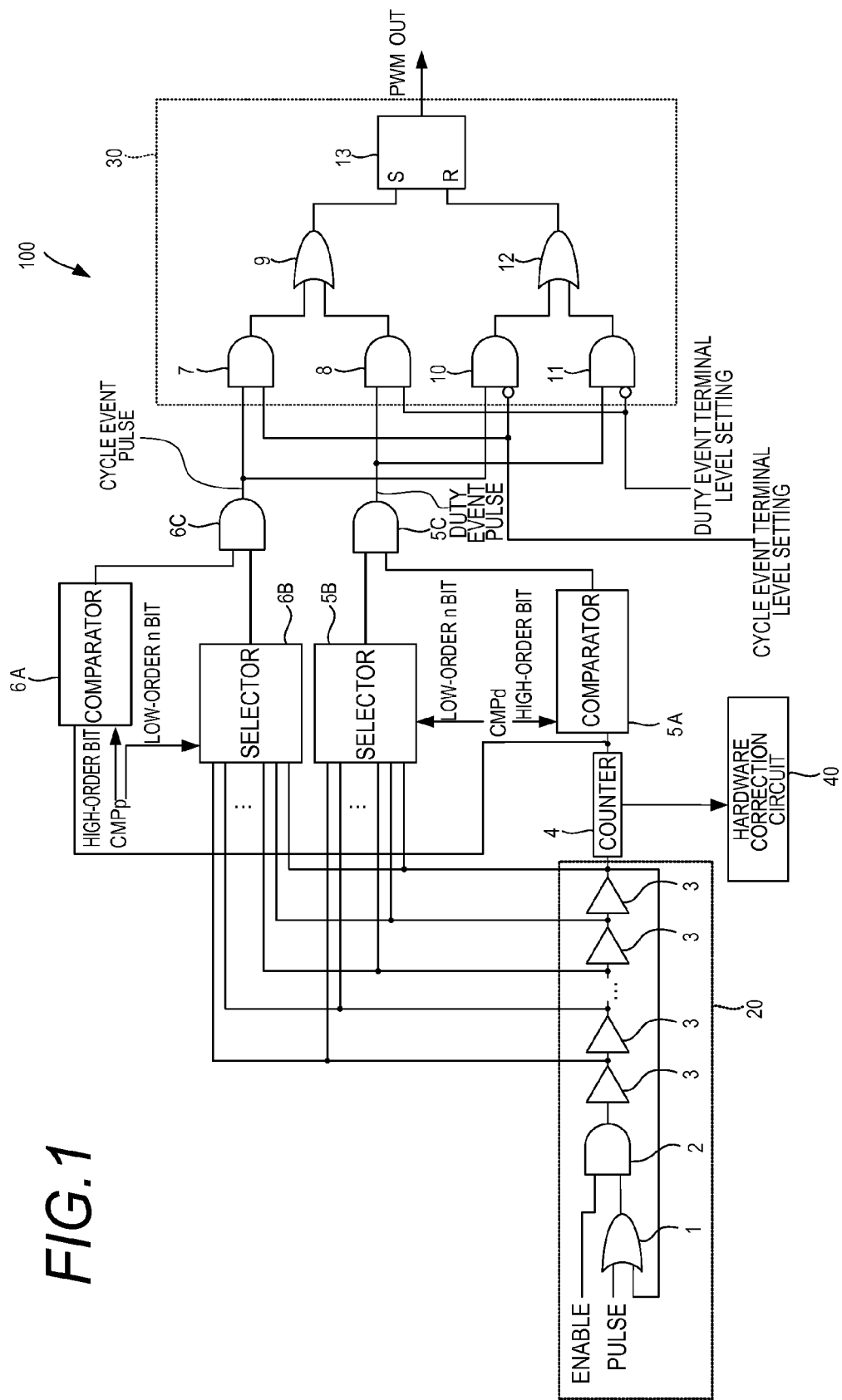
FIG. 1 is a circuit diagram schematically illustrating a configuration of a PWM signal generator used for a switching power supply device according to an embodiment of this disclosure.

FIG. 1 is a circuit diagram schematically illustrating a configuration of a PWM signal generator 100 used for a switching power supply device according to an embodiment of this disclosure. The switching power supply device includes switching elements such as MOSFETs and a PWM control unit that controls the switching elements based on a PWM signal generated by the PWM signal generator 100.

The PWM signal generator 100 includes a delay circuit unit 20, a PWM signal output unit 30, a hardware correction circuit 40, a counter 4, a comparator 5A, a selector 5B, an AND circuit 5C, a comparator 6A, a selector 6B, and an AND circuit 6C.

The delay circuit unit 20 includes a delay element group having plural (2' (where n is a natural number equal to or greater than 1) in the example illustrated in FIG. 1) delay elements 3 connected in series, an AND circuit 2, and an OR circuit 1. Each delay element 3 is an element that outputs an input signal with a delay of a predetermined time and employs a general buffer or the like.

The output terminal of the delay element 3 in the final stage of the delay element group is connected to an input terminal of the counter 4 and one input terminal of two input terminals of the OR circuit 1.

A pulse signal is input to the other input terminal of the two input terminals of the OR circuit 1 from a system control unit (not illustrated) which controls the entire switching power supply device. An output terminal of the OR circuit 1 is connected to one input terminal of two input terminals of the AND circuit 2.

An enable signal for activating the operation of the delay circuit unit 20 is input to the other input terminal of the two input terminals of the AND circuit 2 from the system control unit. An output terminal of the AND circuit 2 is connected to an input terminal of the delay element 3 in an initial stage of the delay element group.

When a starting pulse signal is input to the OR circuit 1 in a state where the enable signal is at a high level, in response to rising of this pulse signal, the output of the OR circuit 1 is changed to a high level and the output of the AND circuit 2 is changed to a high level with the rising of the pulse signal, and thus the pulse signal is input to the delay element group. The starting pulse signal is input only once to the OR circuit 1 and then becomes a low level.

The delay element group delays the pulse signal in each delay terminal 3. A pulse signal output from the delay element 3 in the final stage of the delay element group is input to the OR circuit 1, the output of the OR circuit 1 is changed to the high level, and the pulse signal is output from the AND circuit 2. Accordingly, the pulse signal circulates in the delay circuit unit 20.

The counter 4 counts the pulse signal output from the delay element 3 in the final stage of the delay element group, thereby counting a cycle in which the pulse signal circulates once in the delay circuit unit 20. The count value counted by the counter 4 is input to the hardware correction circuit 40, the comparator 5A, and the comparator 6A.

Even when an output signal of any element of all the elements including the AND circuit 2 and the $2^n$ delay elements 3 in the delay circuit unit 20 is input to the counter 4, the cycle is able to be counted.

The output terminals of the delay elements 3 of the delay element group are connected to the input terminal of the selector 5B and the input terminal of the selector 6B.

Low-order n bits of a duty comparison value CMPd of a digital value generated by the hardware correction circuit 40 are input to the selector 5B. The duty comparison value CMPd is information which is used to determine the length of the ON-period of a switching element.

The selector 5B selects and outputs any one of the output signals of the $2^n$ delay elements 3 of the delay element group based on the low-order n bits of the input duty comparison value CMPd. The output terminal of the selector 5B is connected one of two input terminals of the AND circuit 5C.

The output terminal of the comparator 5A is connected to the other of the two input terminals of the AND circuit 5C. When the output of the comparator 5A is changed to a high level, the AND circuit 5C outputs the signal selected by the selector 5B as a duty event pulse to the PWM signal output unit 30.

The output signal of the counter 4 and the high-order bits of the duty comparison value CMPd are input to the comparator 5A. The comparator 5A compares the output signal of the counter 4 which is input to the comparator with the high-order bits of the duty comparison value CMPd and outputs a high-level signal to the AND circuit 5C when both are identical each other.

Low-order n bits of a cycle comparison value CMPp of a digital value generated by the hardware correction circuit 40 are input to the selector 6B. The cycle comparison value CMPp is information which is used to determine a start timing of the ON-period of a switching element.

The selector 6B selects and outputs any one of the output signals of the $2^n$ delay elements 3 of the delay element group according to the input low-order n bits of the cycle comparison value CMPp. The output terminal of the selector 6B is connected to one of two input terminals of the AND circuit 6C.

The output terminal of the comparator 6A is connected to the other of the two input terminals of the AND circuit 6C. When the output of the comparator 6A is changed to a high level, the AND circuit 6C outputs the signal selected by the selector 6B as a cycle event pulse to the PWM signal output unit 30.

The output signal of the counter 4 and the high-order bits of the cycle comparison value CMPp are input to the comparator 6A. The comparator 6A compares the output signal of the counter 4 which is input to the comparator with the high-order bits of the cycle comparison value CMPp and outputs a high-level signal to the AND circuit 6C when both are identical each other.

The PWM signal output unit 30 outputs a PWM signal which rises in response to the rising of the cycle event pulse and falls in response to the rising of the duty event pulse. Specifically, the PWM signal output unit 30 includes an AND circuit 7, an AND circuit 8, an OR circuit 9, an AND circuit 10, an AND circuit 11, an OR circuit 12, and an RS type flip-flop 13.

The output signal (cycle event pulse) of the AND circuit 6C and a cycle event terminal level setting signal from the system control unit are input to the input terminals of the AND circuit 7.

The output signal (duty event pulse) of the AND circuit 5C and a duty event terminal level setting signal from the system control unit are input to the input terminals of the AND circuit 8.

The output signal (cycle event pulse) of the AND circuit 6C and an inverted signal of the cycle event terminal level setting signal are input to the input terminals of the AND circuit 10.

The output signal (duty event pulse) of the AND circuit 5C and an inverted signal of the duty event terminal level setting signal are input to the input terminals of the AND circuit 11.

The output signal of the AND circuit 7 and the output signal of the AND circuit 8 are input to the OR circuit 9. The output terminal of the OR circuit 9 is connected to a setting terminal S of the RS type flip-flop 13.

The output signal of the AND circuit 10 and the output signal of the AND circuit 11 are input to the OR circuit 12. The output terminal of the OR circuit 12 is connected to a reset terminal of the RS type flip-flop 13.

Figure 2:
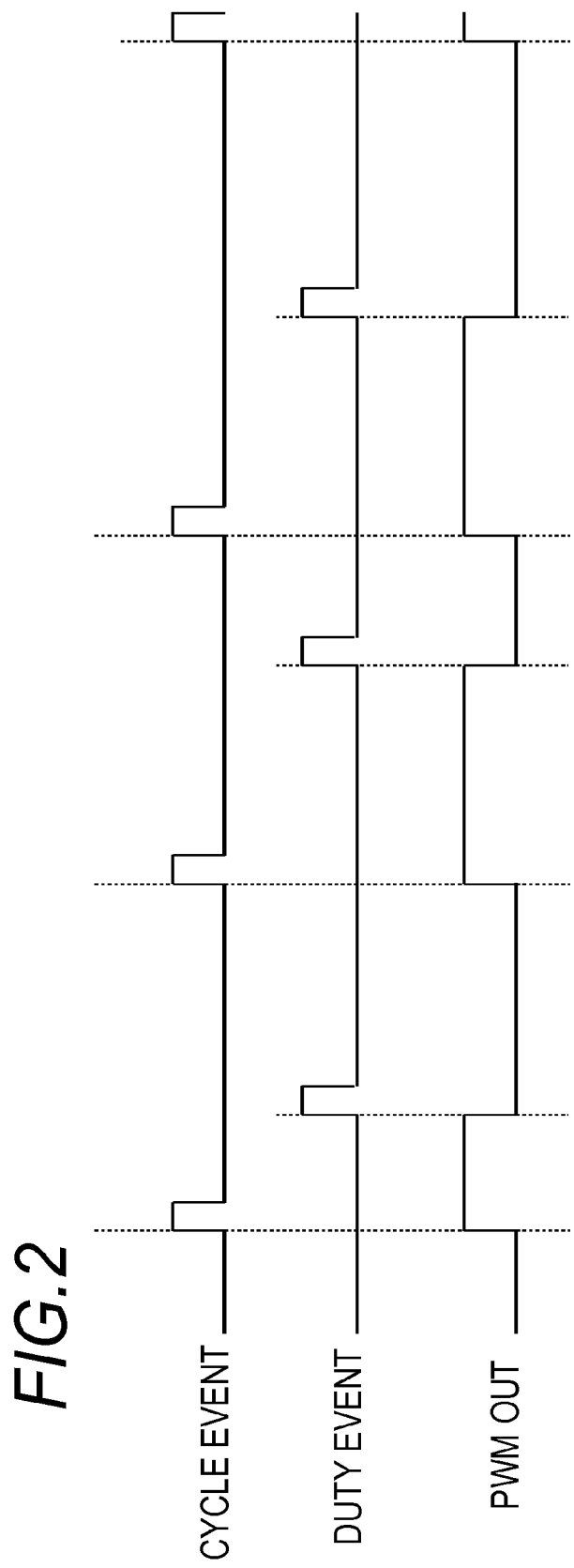
FIG. 2 is a timing chart illustrating operations of a PWM signal output unit of the PWM signal generator illustrated in FIG. 1.

FIG. 2 is a timing chart illustrating operations of the PWM signal output unit 30 of the PWM signal generator 100 illustrated in FIG. 1. FIG. 2 illustrates a case in which the cycle event terminal level is set to 1 (high level) and the duty event terminal level is set to 0 (low level).

As illustrated in FIG. 2, when the cycle event pulse is changed to a high level, the output of the AND circuit 7 is changed to a high level, the output of the OR circuit 9 is changed to a high level, the RS type flip-flop 13 is changed to a set state, and the PWM signal rises. Then, when the duty event pulse is changed to a high level, the output of the AND circuit 11 is changed to a high level, the output of the OR circuit 12 is changed to a high level, the RS type flip-flop 13 is reset, and the PWM signal falls. In this way, the PWM signal is generated based on the cycle event pulse and the duty event pulse.

Figure 3:
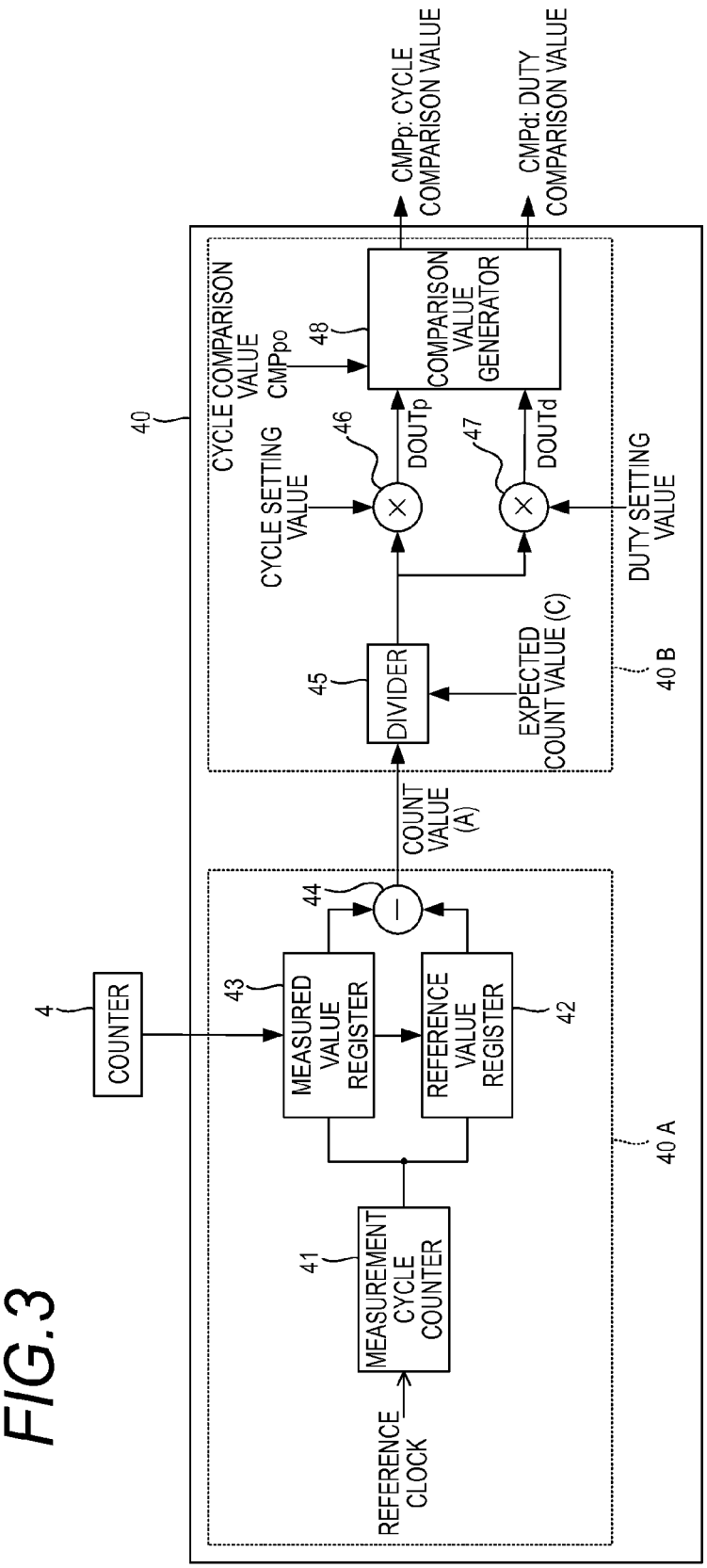
FIG. 3 is a circuit diagram specifically illustrating a configuration of a hardware correction circuit of the PWM signal generator illustrated in FIG. 1.

FIG. 3 is a circuit diagram specifically illustrating the configuration of the hardware correction circuit 40 of the PWM signal generator 100 illustrated in FIG. 1.

The hardware correction circuit 40 includes a delay-amount detector 40A and a digital value generator 40B.

The delay-amount detector 40A is a circuit which is constructed by hardware to detect an amount of delay of a signal due to the delay circuit unit 20.

Specifically, the delay-amount detector 40A includes a measurement cycle counter 41, a reference value register 42, a measured value register 43, and a subtractor 44.

The measurement cycle counter 41 outputs a capture signal to the reference value register 42 and the measured value register 43 for every unit period depending on a reference clock.

The measured value register 43 is a first register that holds the count value of the counter 4 at an input timing where the capture signal is input.

When a capture signal is input, the reference value register 42 is a second register that holds the count value of the counter 4 at an input timing where the capture signal is input immediately previous to the input timing. That is, the count value at a first timing where the capture signal is input is held in the measured value register 43, and the count value at a second timing which is previous to the first timing by a unit period is held in the reference value register 42.

The subtractor 44 subtracts the count value held in the reference value register 42 from the count value held in the measured value register 43. The subtraction result (count value (A)) is a count value counted by the counter 4 in the unit period. The output value of the subtractor 44 is a time (amount of delay) by which delayed by the delay circuit unit 20 in the unit period. In this way, the delay-amount detector 40A detects the output value of the subtractor 44 as an amount of delay of a signal due to the delay circuit unit 20.

The digital value generator 40B is a circuit which is constructed by hardware to correct predetermined data (cycle comparison value CMPpo) based on the count value (A), which is an amount of delay detected by the delay-amount detector 40A, thereby generating the cycle comparison value CMPp and the duty comparison value CMPd.

Specifically, the digital value generator 40B includes a divider 45, a multiplier 46, a multiplier 47, and a comparison value generator 48.

The output value (count value (A)) of the subtractor 44 and a predetermined expected count value (C) are input to the divider 45. The expected count value (C) is a designed value of the amount of delay by the delay circuit unit 20, and a cycle setting value and a duty setting value as a setting values corresponding to the cycle comparison value CMPpo are determined in advance based on the designed value and are stored in a storage unit (not illustrated) of the PWM signal generator 100.

The divider 45 divides the count value (A) by the expected count value (C) and outputs the division result as a correction coefficient. The divider 45 is constructed by hardware.

The expected count value (C) is not particularly limited, but it is preferable that the expected count value be set to $2^k$ where k is a natural number equal to or greater than 1. By setting the expected count value (C) to $2^k$, the calculation of count value (A)/expected count value (C) is able to be realized by k-bit shift of the count value (A) to the right. That is, since the divider 45 is able to be constructed by a simple bit shifter (shifter), it is possible to simplify the configuration of the hardware correction circuit 40.

The correction coefficient output from the divider 45 and the cycle setting value stored in the storage unit are input to the multiplier 46. The multiplier 46 generates a post-correction cycle setting value DOUTp by multiplying the correction coefficient by the cycle setting value.

The correction coefficient output from the divider 45 and the duty setting value stored in the storage unit are input to the multiplier 47. The multiplier 47 generates a post-correction duty setting value DOUTd by multiplying the correction coefficient by the duty setting value.

The comparison value generator 48 generates a cycle comparison value CMPp by adding the cycle setting value DOUTp output from the multiplier 46 to the cycle comparison value CMPpo corresponding to the cycle setting value read from the storage unit. The comparison value generator 48 generates a duty comparison value CMPd by adding the duty setting value DOUTd output from the multiplier 47 to the generated cycle comparison value CMPp.

In the digital value generator 40B, the positions of the divider 45 and the multipliers 46 and 47 may be reversed. That is, the cycle setting value DOUTp may be calculated by causing the multiplier 46 to multiply the count value (A) by the cycle setting value and causing the divider 45 to divide the resultant value by the expected count value (C). Similarly, the duty setting value DOUTd may be calculated by causing the multiplier 47 to multiply the count value (A) by the duty setting value and causing the divider 45 to divide the resultant value by the expected count value (C). When a bit shifter is used as the divider 45, there is a possibility that a rounding error of low-order bits will occur due to the k-bit shift to the right, but by multiplying ahead like this, calculation errors of the cycle setting value and the duty setting value due to this error is able to be minimized.

In the PWM signal generator 100 having this configuration, the amount of delay of a signal due to the delay circuit unit 20 is designed to a desired value, but the amount of delay may be deviated from the desired value due to an influence of PVT. The deviation of the amount of delay from the designed value is calculated as a count value (A) for each unit period by the delay-amount detector 40A of the hardware correction circuit 40. The cycle comparison value CMPpo is appropriately corrected based on the correction coefficient which is the ratio of the count value (A) and the expected count value (C), and the cycle comparison value CMPp and the duty comparison value CMPd are appropriately corrected.

Accordingly, the deviation of the amount of delay of a signal due to the delay circuit unit 20 is able to be absorbed by the correction of the cycle comparison value CMPp and the duty comparison value CMPd, and it is thus possible to realize an increase in resolution of a PWM signal while maintaining a desired cycle and a desired duty.

In the PWM signal generator 100, deviations of the degrees of delay of the individual delay elements 3 of the delay circuit unit 20 from the designed value are not detected, but the deviation of the amount of delay of the delay circuit unit 20 from the designed value as a whole is detected. In this way, since it is not necessary to detect the deviations of the degrees of delay of the individual delay elements 3, it is possible to simplify the device and thus to reduce manufacturing costs.

In the PWM signal generator 100, the delay elements 3 of the delay circuit unit 20 is able to be constructed by simple buffers. Accordingly, in comparison with the related art in which the voltage-controlled buffers or the differential buffers are used, it is possible to reduce the manufacturing costs of the PWM signal generator 100. Unlike the related art, it is not necessary to use the DLL circuit. Accordingly, it is possible to reduce the design costs and to reduce restrictions on the lowest clock frequency, the setting order, and the like.

In the PWM signal generator 100, the delay-amount detector 40A and the digital value generator 40B are embodied by hardware, not by software. Accordingly, it is not necessary to enhance the processing capability of the system control unit (CPU) of the switching power supply device, and thus it is possible to prevent an increase in costs of the power supply device.

In the PWM signal generator 100, the hardware correction circuit 40 is able to be operated based on a reference clock in asynchronism with a part other than the hardware correction circuit 40. Accordingly, it is possible to facilitate designing of the switching power supply device.

While this disclosure has been described above with reference to specific embodiments, the embodiments are only examples and is able to be modified in various forms without departing from the gist of this disclosure.

For example, the hardware correction circuit 40 is constructed by hardware, but the function of the hardware correction circuit 40 may be embodied by software.

In consideration of the delay time of a signal by the OR circuit 1 and the AND circuit 2 included in the delay circuit unit 20, the number of delay elements 3 included in the delay element group may be reduced by one may be set to $2^n-1$. By setting the delay time of a signal by the OR circuit 1 and the AND circuit 2 to be the same as the delay time of the delay elements 3, it is possible to facilitate designing of the cycle comparison value or the duty comparison value.

The delay-amount detector 40A performs the process of detecting an amount of delay for every unit period, but the period of time until the detection process is performed next time after the process of detecting an amount of delay is performed may be set to be sufficiently long and the process of detecting an amount of delay may be performed in a period sufficiently longer than the unit period. By correcting the cycle comparison value CMPp and the duty comparison value CMPd for every predetermined period, it is possible to accurately perform the PWM control.

As described above, this specification discloses the followings.

The disclosed PWM signal generator includes: a delay circuit unit, which includes a plurality of delay elements connected in series, an output terminal of the delay element in a final stage among the plurality of delay elements and an input terminal of the delay element in an initial stage among the plurality of delay elements being connected to each other; a selector, which selects any one of output signals of the plurality of delay elements based on a digital value; a PWM signal output unit, which outputs a PWM signal based on the output signal selected by the selector; a delay-amount detector, which detects an amount of delay of a signal due to the delay circuit unit; and a digital value generator, which generate the digital value by correcting predetermined data based on the amount of delay detected by the delay-amount detector.

The disclosed PWM signal generator may further include a counter, which counts a pulse signal output from any delay element among the plurality of delay elements, wherein the delay-amount detector detects a count value, which is counted by the counter in a unit period, as the amount of delay.

In the disclosed PWM signal generator, the digital value generator may generates the data by correcting the digital value based on the count value and a predetermined expected count value in the unit time.

In the disclosed PWM signal generator, the plural delay elements may include $2^n$ delay elements where n is a natural number equal to or greater than 2, wherein the expected count value is $2^k$ where k is a natural number equal to or greater than 1, and wherein the digital value generator generates the digital value by using a value which is obtained by dividing a multiplied value of the count value and a set value corresponding to the data by the expected count value.

In the disclosed PWM signal generator, the digital value generator may include: a multiplier, which multiplies the count value and the set value; and a divider, which divides an output value of the multiplier by the expected count value, and wherein the divider is a bit shifter that acquires a division result by shifting the output value of the multiplier by k bits to the right.

In the disclosed PWM signal generator, the digital value generator may include: a divider configured to divide the count value by the expected count value; and a multiplier configured to multiply an output value of the divider and the set value, and wherein the divider is a bit shifter that acquires a division result by shifting the output value by k bits to the right.

In the disclosed PWM signal generator, the delay-amount detector may include: a measurement cycle counter, which outputs a capture signal for every unit period based on a reference clock; a first register, which holds the count value of the counter at a timing where the capture signal is output; a second register, which holds the count value of the counter at a timing where the capture signal is output previous to the timing the capture signal is output; and a subtractor, which subtracts the count value held in the second register from the count value held in the first register, and wherein the delay-amount detector detects the output value of the subtractor as the amount of delay.

In the disclosed PWM signal generator, the delay-amount detector and the digital value generator may be constructed by hardware.

The disclosed switching power supply device includes: a switching element; the PWM signal generator; and a PWM control unit which controls the switching element based on the PWM signal generated by the PWM signal generator.

What is claimed is:
1. A PWM signal generator comprising:
a delay circuit unit, which includes a plurality of delay elements connected in series, an output terminal of the delay element in a final stage among the plurality of delay elements and an input terminal of the delay element in an initial stage among the plurality of delay elements being connected to each other;
a selector, which selects any one of output signals of the plurality of delay elements based on a digital value;
a PWM signal output unit, which outputs a PWM signal based on the output signal selected by the selector;
a delay-amount detector, which detects an amount of delay of a signal due to the delay circuit unit;
a digital value generator, which generates the digital value by correcting predetermined data based on the amount of delay detected by the delay-amount detector; and
a counter, which counts a pulse signal output from any delay element among the plurality of delay elements,
wherein the delay-amount detector detects a count value, which is counted by the counter in a unit period, as the amount of delay, and
wherein the digital value generator generates the predetermined data by correcting the digital value based on the count value and a predetermined expected count value in the unit period.

2. The PWM signal generator according to claim 1,
wherein the plurality of delay elements includes $2^n$ delay elements where n is a natural number equal to or greater than 2,
wherein the expected count value is $2^k$ where k is a natural number equal to or greater than 1, and
wherein the digital value generator generates the digital value by using a value which is obtained by dividing a multiplied value of the count value and a set value corresponding to the predetermined data by the expected count value.

3. The PWM signal generator according to claim 2, wherein the digital value generator includes:
a multiplier, which multiplies the count value and the set value; and
a divider, which divides an output value of the multiplier by the expected count value,
wherein the divider is a bit shifter that acquires a division result by shifting the output value of the multiplier by k bits to the right.

4. The PWM signal generator according to claim 2, wherein the digital value generator includes:
a divider configured to divide the count value by the expected count value; and
a multiplier configured to multiply an output value of the divider and the set value, and
wherein the divider is a bit shifter that acquires a division result by shifting the output value by k bits to the right.

5. The PWM signal generator according to claim 1, wherein the delay-amount detector includes:
a measurement cycle counter, which outputs a capture signal for every unit period based on a reference clock;
a first register, which holds the count value of the counter at a timing where the capture signal is output;
a second register, which holds the count value of the counter at a timing where the capture signal is output previous to the timing the capture signal is output; and
a subtractor, which subtracts the count value held in the second register from the count value held in the first register to generate an output value,
wherein the delay-amount detector detects the output value of the subtractor as the amount of delay.

6. The PWM signal generator according to claim 1, wherein the delay-amount detector and the digital value generator are constructed by hardware.

7. A switching power supply device comprising:
a switching element;
the PWM signal generator according to claim 1; and
a PWM control unit, which controls the switching element based on the PWM signal generated by the PWM signal generator.

* * * * *